(12) United States Patent
Cho et al.

(10) Patent No.: US 6,768,179 B2
(45) Date of Patent: Jul. 27, 2004

(54) CMOS OF SEMICONDUCTOR DEVICE AND METHOD FOR MANUFACTURING THE SAME

(75) Inventors: Heung Jae Cho, Eiwang-shi (KR); Dae Gyu Park, Ichon-shi (KR); Kwan Yong Lim, Suwon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/663,910

(22) Filed: Sep. 17, 2003

(65) Prior Publication Data

US 2004/0061150 A1 Apr. 1, 2004

Related U.S. Application Data

(62) Division of application No. 10/253,779, filed on Sep. 25, 2002, now Pat. No. 6,642,132.

(30) Foreign Application Priority Data

Nov. 1, 2001 (KR) ......................................... 2001-67848

(51) Int. Cl.$^7$ ............................................. H01L 29/94
(52) U.S. Cl. ...................................... 257/371; 257/369
(58) Field of Search .................................. 257/371, 369

(56) References Cited

U.S. PATENT DOCUMENTS

| | | | |
|---|---|---|---|
| 6,358,787 B2 * | 3/2002 | Dennison et al. ........... | 438/231 |
| 6,362,047 B1 | 3/2002 | Ventajol | |
| 6,444,523 B1 | 9/2002 | Fan et al. | |
| 6,461,959 B1 * | 10/2002 | Chien et al. ................ | 438/672 |
| 6,531,353 B2 | 3/2003 | Lee | |
| 2002/0072156 A1 | 6/2002 | Lee et al. | |
| 2003/0011017 A1 | 1/2003 | Lee et al. | |

FOREIGN PATENT DOCUMENTS

| KR | 1995-7004816 | 11/1995 |
|---|---|---|
| KR | 2001-0062112 | 7/2001 |

* cited by examiner

*Primary Examiner*—David Nelms
*Assistant Examiner*—Tu-Tu Ho
(74) *Attorney, Agent, or Firm*—Pillsbury Winthrop LLP

(57) ABSTRACT

CMOS device arrangements have a surface channel, and a method for manufacturing the same by forming a multi-layer that includes a first metal layer, a polysilicon layer and a second metal layer having a work function from 4.8 through 5.0 eV on a cell region NMOS and a gate electrode of a peripheral circuit region PMOS, and by forming a multi-layer that includes a polysilicon layer and a second metal layer on a gate electrode of a peripheral circuit region NMOS. Because of the multi-layered gate electrode, a separate transient ion implantation process is not necessary, which consequently simplified the CMOS manufacturing process, while maintaining the threshold voltage of each peripheral circuit region –0.5V and below, and the threshold voltage of the peripheral circuit region NMOS +0.5V and below. Meantime, since the cell NMOS has the threshold voltage of +1V thanks to the first metal layer, no separate back bias is necessary, thereby forming a device with low power consumption, which consequently improves characteristics, yield and reliability of the device.

6 Claims, 18 Drawing Sheets

CM OS OF SEMICONDUCTOR DEVICE AND METHOD FOR MANUFACTURING THE SAME

CROSS REFRENCE TO RELATED APPLICATIONS

This application is a Divisional Application of U.S. application Ser. No. 10/253,779, filed Sep. 25, 2002, now U.S. Pat. No. 6,642,132 now allowed, the specification and drawings of which are incorporated herein by reference.

BACKGROUND

The inventions described herein relate to complementary metal oxide semiconductor (CMOS) devices and methods of manufacturing such devices. More particularly, the present inventions relate to CMOS devices having enhanced characteristics, high yield and high reliability, and to methods for manufacturing such devices.

BRIEF DESCRIPTION OF THE DRAWINGS

Various features of the inventions will become more fully apparent from the following description and appended claims, taken in conjunction with the accompanying drawings. Understanding that these drawings depict only typical embodiments of the invention and are, therefore not to be considered limiting of its scope, the invention will be described with additional specificity and detail through use of the accompanying drawings in which:

DETAILED DESCRIPTION

Generally, a CMOS device includes PMOS transistors with low power consumption and NMOS capable transistors of high-speed operation formed symmetrically. Although it has a low degree of integration and a complicated manufacturing process, CMOS devices are generally characterized by low power consumption.

Figure 1:
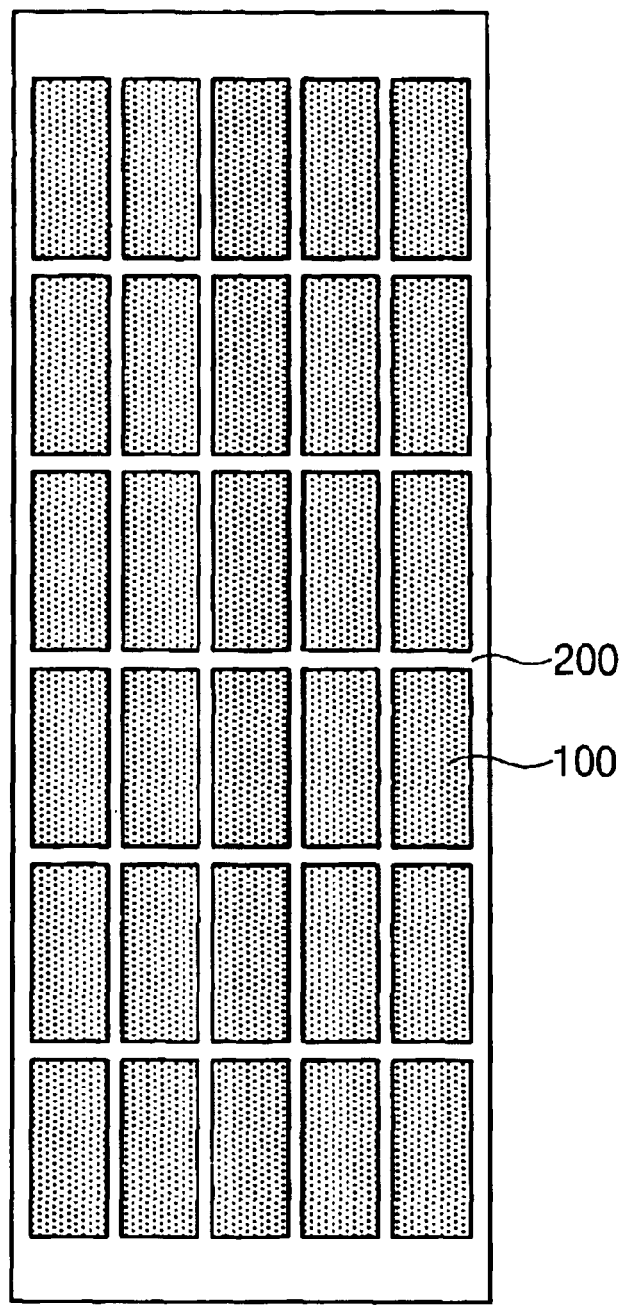
FIG. 1 is a plan view showing a cell and a peripheral circuit region.

FIG. 1 is a plane view illustrating a cell region and a peripheral circuit region of a semiconductor device.

Referring to FIG. 1, in the CMOS device, the threshold voltage of the NMOS in the cell region 100 should be approximately +1V to reduce the off current during operation of the device, and the threshold voltage of the PMOS and NMOS in the peripheral circuit region 200 shouldhigher than −0.5V and lower than +0.5V, to increase the operating speed. A separate mask and excessive ion implantation is required to achieve this result, which complicates the manufacturing process.

The CMOS gate electrode is typically formed of polysilicon layer with a high melting point as a result of the ease of deposition of the thin film and line pattern, stability against oxidation atmosphere and ease of planarization.

The conventional gate electrode employs n+ polysilicon for both NMOS and PMOS regions. However, a buried channel is formed due to counter doping in the PMOS region, which results in short channel effects and an increase in leakage current.

In an attempt to overcome these disadvantages, a dual gate electrode which employs $n^+$ polysilicon as a gate electrode in the NMOS region, and $p^+$ polysilicon in the PMOS region is used to form a surface channel on both NMOS and PMOS regions.

FIGS. 2a through 2e are cross sectional views illustrating a method for manufacturing the conventional CMOS, wherein "A" indicates a region on which a cell region NMOS is to be formed, "B" indicates a region on which a peripheral circuit region PMOS is to be formed, and "C" indicates a region on which a peripheral circuit region NMOS is to be formed.

Figure 2A:
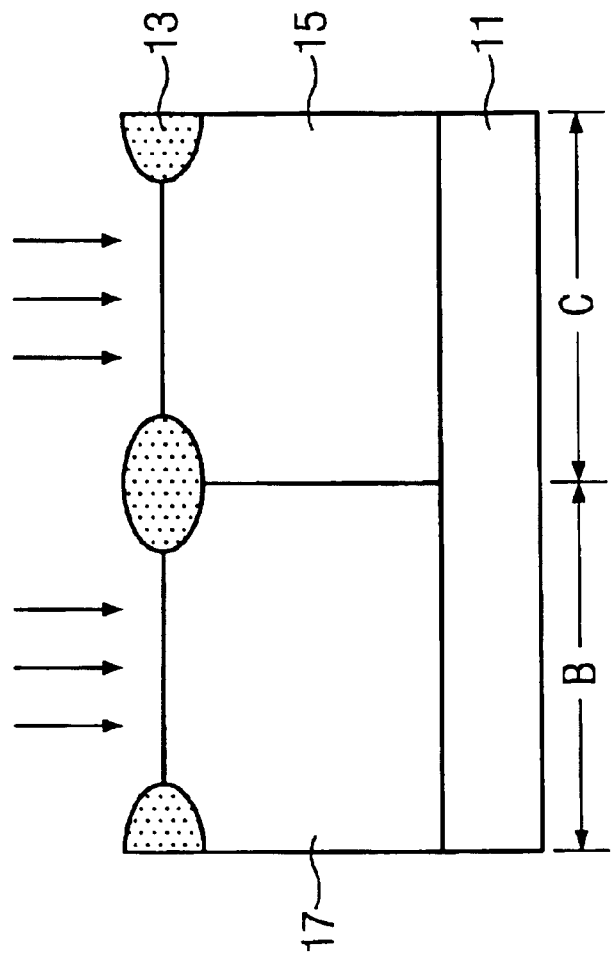
FIGS. 2a through 2e are cross sectional views showing a method for manufacturing a CMOS of a semiconductor device in the related art.
Figure 2A:
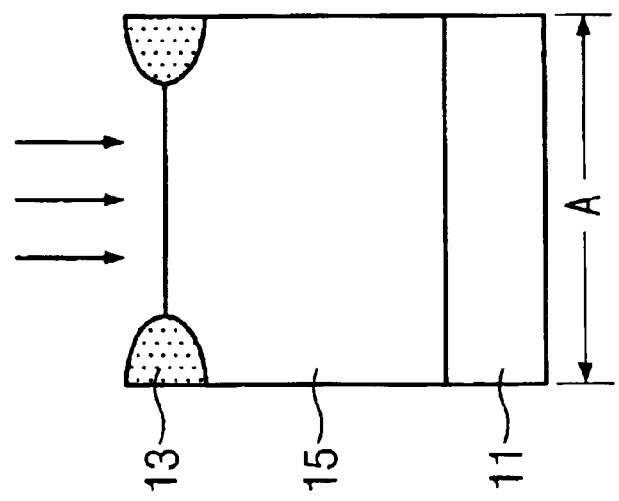

Referring to FIG. 2a, a field oxide 13 defining an active region is formed on a semiconductor substrate 11.

Then, using an ion implantation mask, p-type and n-type impurites are selectively injected into the semiconductor substrate 11, and a drive-in process is performed to form p-well 15 and n-well 17.

Figure 2B:
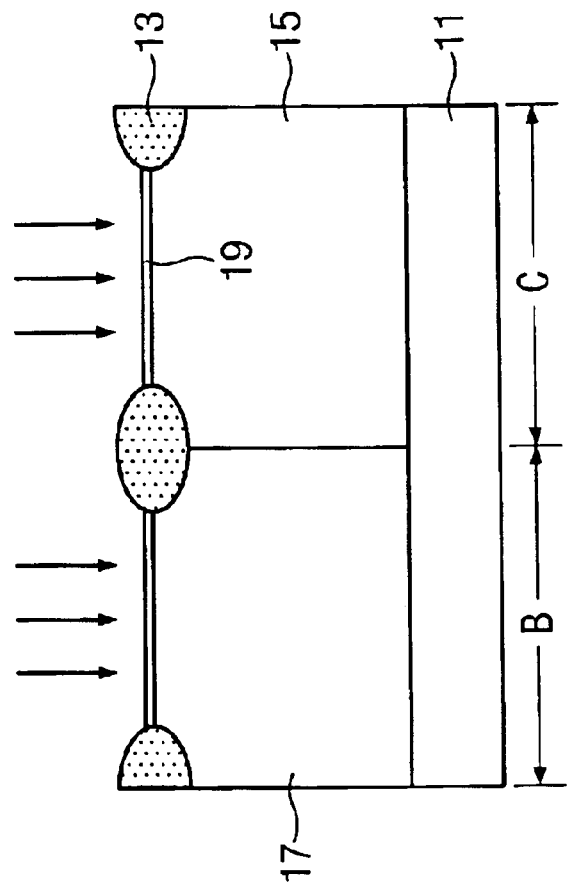
Figure 2B:
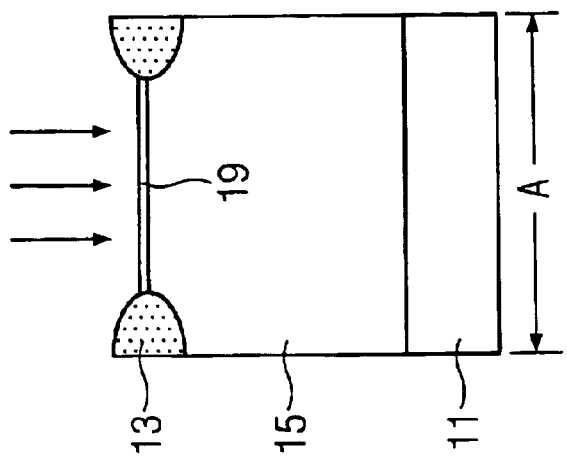

Referring to FIG. 2b, a first oxide film 19 is grown on the semiconductor substrate 11 by a thermal oxidation process, and impurity ions for adjusting the threshold voltage are implanted to the resulting structure. Here, the first oxide film 19 prevents generation of surface defects in the semiconductor substrate 11 during the ion implantation of the impurity ions necessary to adjust the threshold voltage.

Figure 2C:
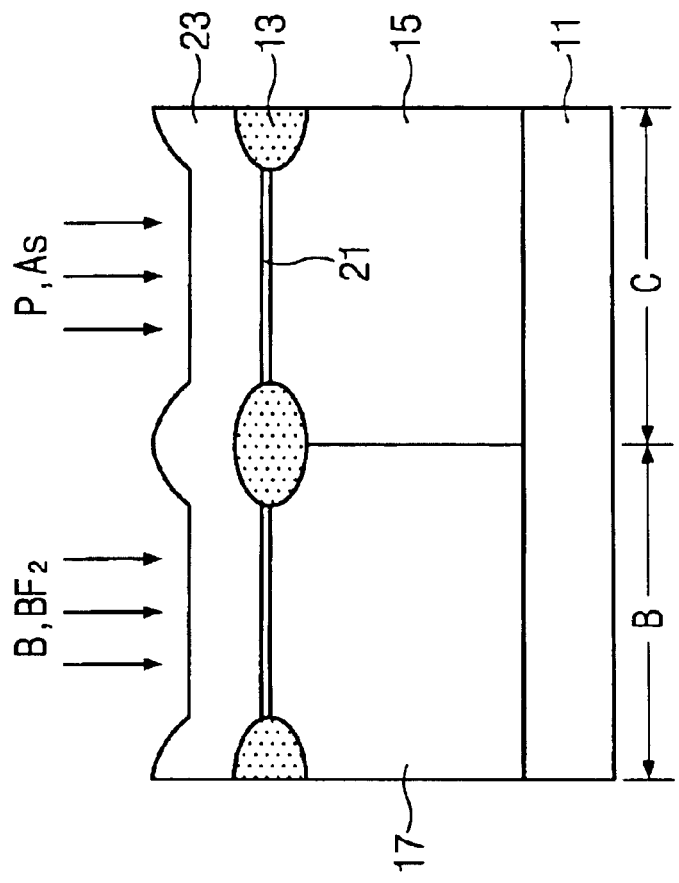

Referring to FIG. 2c, the first oxide film 19 is removed, and a second oxide film 21 and undoped polysilicon layer 23 are formed on the resulting structure.

Subsequently, the polysilicon layer 23 on the p-well 15 is doped with n-type impurities such as phosphorous (P) or arsenic (As) ions by performing an ion implantation using n-well mask (not shown).

Next, the polysilicon layer 23 on the n-well 17 is doped with p-type impurities such as boron (B) or $BF_2$ ions by performing an ion implantation using a p-well mask.

Figure 2D:
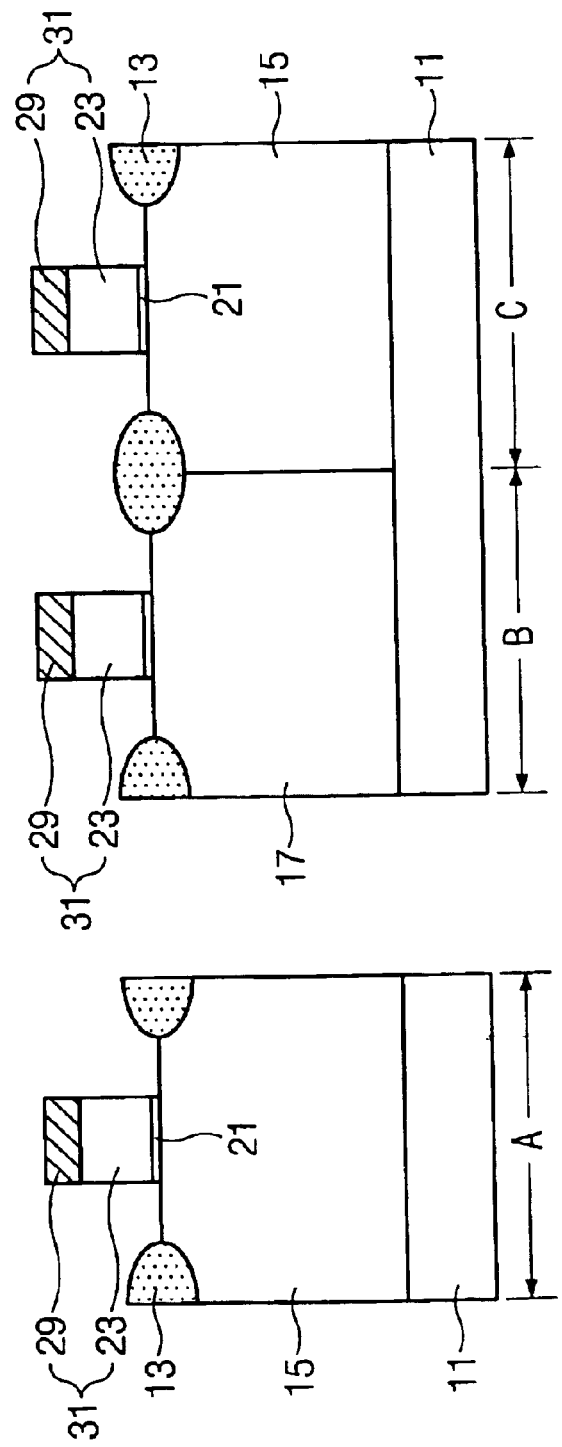

Referring to FIG. 2d, a metal layer 29 is formed on the polysilicon layer 23.

The metal layer 29, the polysilicon layer 23 and the second oxide film 21 are selectively etched by performing a photolithography process using a gate electrode mask, thereby forming a gate oxide of the second oxide film 21 and a gate electrode 31 on the upper side of the p-well 15 and the n-well 17, respectively. Here, the gate electrode 31 comprises a stacked structure of the polysilicon layer 23 and the metallic layer 29.

Figure 2E:
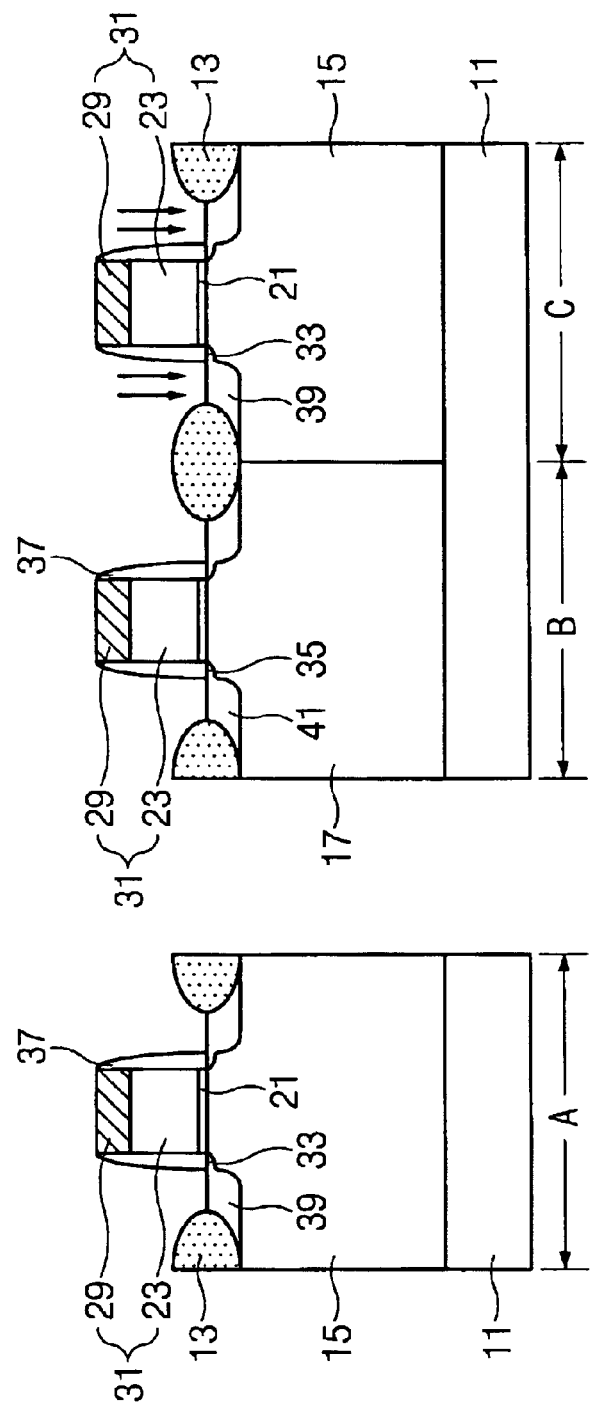

Referring to FIG. 2e, a low concentration n-type impurity region 33 is formed in the p-well 15 on both sides of the gate electrode 31 by performing an ion implantation of n-type impurity ions using the n-well mask (not shown) followed by a drive-in process.

Thereafter a low concentration p-type impurity region 35 is formed in the n-well 17 on both sides of the gate electrode 31 by performing an ion implantation of a low concentration of p-type impurity ions using the p-well mask (not shown) followed by a drive-in process.

Then a nitride spacer 37 is formed on a side wall of the gate electrode 31.

Subsequently, a high concentration n-type impurity region 39 is formed in the p-well 15 on both sides of the gate electrode 31 including the nitride spacer 37 by performing an ion implantation of a high concentration of n-type impurity ions using the n-well mask (not shown) followed by a drive-in process.

Thereafter, a high concentration p-type impurity region 41 is formed in the n-well 17 on both sides of the gate electrode 31 including the nitride spacer 37 by performing an ion implantation with a high concentration p-type impurity ions using the n-well mask (not shown) and the drive-in process.

As described above, since the conventional CMOS device and its manufacturing method involves the formation of the dual polysilicon gate electrode, the device characteristics of the conventional CMOS device are degraded by the following effects.

First, when boron in the gate oxide film region of a $p^+$ polysilicon gate electrode in the PMOS region is not activated, a gate depletion effect of the gate electrode is generated at the CMOS polysilicon gate electrode, decreasing reverse capacitance and increasing threshold voltage.

Second, the phenomenon of the remaining boron ions in the $p^+$ polysilicon gate electrode penetrating the gate oxide film to diffuse into the channel region of the semiconductor substrate, i.e., boron penetration phenomenon occurs. As a result, the flat band voltage and the threshold voltage are varied, and the gate oxide integrity (GOI) characteristics deteriorate.

According to the inventions described herein, there are provided CMOS device arrangements. Also provided are methods of manufacturing CMOS arrangements by forming a multi-layer that includes a first metal layer/a polysilicon layer/a second metal layer having a work function from 4.8 through 5.0 eV on NMOS of a cell region and a gate electrode of a peripheral circuit region PMOS, and by forming a multi-layer that includes a polysilicon layer/a second metal layer on a gate electrode of a peripheral circuit region NMOS, thereby preventing gate depletion effect and boron penetration, being generated in a traditional dual gate electrode if a doping process is not properly conducted thereon during the formation of the PMOS gate electrode.

There is provided a CMOS of a semiconductor device, which includes a first gate electrode having layers of a first metal layer/a polysilicon layer/a second metal layer on a cell p-well region and a peripheral circuit region n-well region, and a second gate electrode having layers of a polysilicon layer/a second metal layer on a peripheral p-well region.

There are also provided methods for manufacturing a CMOS of a semiconductor device, which include: forming a first metal layer on a cell p-well region and a peripheral circuit region n-well region of a semiconductor substrate with a gate insulation film; forming a polysilicon layer and a second metal layer sequentially on an entire upper surface; and forming a first gate electrode having layers of a first metal layer/a polysilicon layer/a second metal layer on the p-well of the cell and the n-well of the peripheral circuit region, and simultaneously forming a second gate having layers of a polysilicon layer/a second metal layer on a peripheral circuit region p-well, by conducting a photolithography using a gate electrode mask.

A CMOS device arrangement having a surface channel is developed by forming a first gate electrode composed of layers of a first metal layer/a polysilicon layer/a second metal layer with a work function from 4.8 through 5.0 eV on the cell NMOS and the peripheral circuit region PMOS, and by forming a second gate electrode composed of layers of a polysilicon layer/a second metal layer on the peripheral circuit region NMOS.

As a result of the layers on the first and the second gate electrodes, it is possible to obtain the threshold voltage of each peripheral circuit region PMOS as −0.5V and below, the threshold voltage of the peripheral circuit region NMOS as +0.5V and below, and the threshold voltage of the cell NMOS as +1V because of the first metal layer, without transient ion implantation process.

A specific exemplary embodiment of the inventions will now be described with reference to the accompanying drawings. In the following description, same drawing reference numerals are used for the same elements even in different drawings. The matters defined in the description are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

FIGS. 3a through 3e are cross sectional view illustrating a method for manufacturing a complementary metal oxide semiconductor (CMOS) of a semiconductor device in accordance with a first embodiment of the inventions. "A" indicates a region on which a cell NMOS is to be formed, "B" indicates a region on which a peripheral circuit region PMOS is to be formed, and "C" indicates a region on which a peripheral circuit region NMOS is to be formed.

Figure 3A:
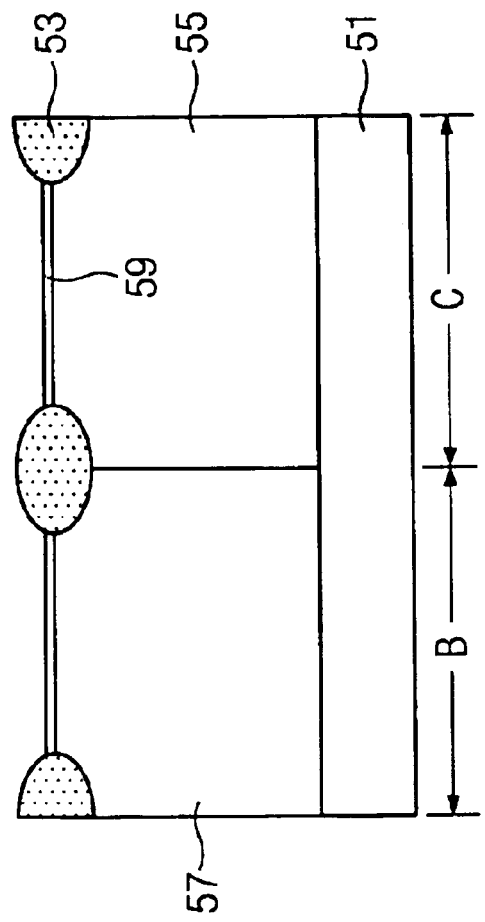
FIGS. 3a through 3e are cross sectional views showing a method for manufacturing a CMOS of a semiconductor device in accordance with a first embodiment of the present invention.

Referring to FIG. 3a, a device isolation film 53 defining an active region is formed on a semiconductor substrate 51.

Thereafter, p-type or n-type impurities are selectively ion implanted into the semiconductor substrate 51 using an ion implantation mask, and a drive-in process is performed to form a p-well 55 and an n-well 57.

Next, a first oxide film 59, which is a gate oxide film, is grown to a thickness of 5 to 100 Å by thermally oxidizing the semiconductor substrate 51. A high dielectric film which is not reactive with polysilicon such as $Al_2O_3$, $HfO_2$, $Hf.SiO_2$, or $Zr.SiO_2$ film can also be used instead of a thermal oxide film.

Figure 3B:
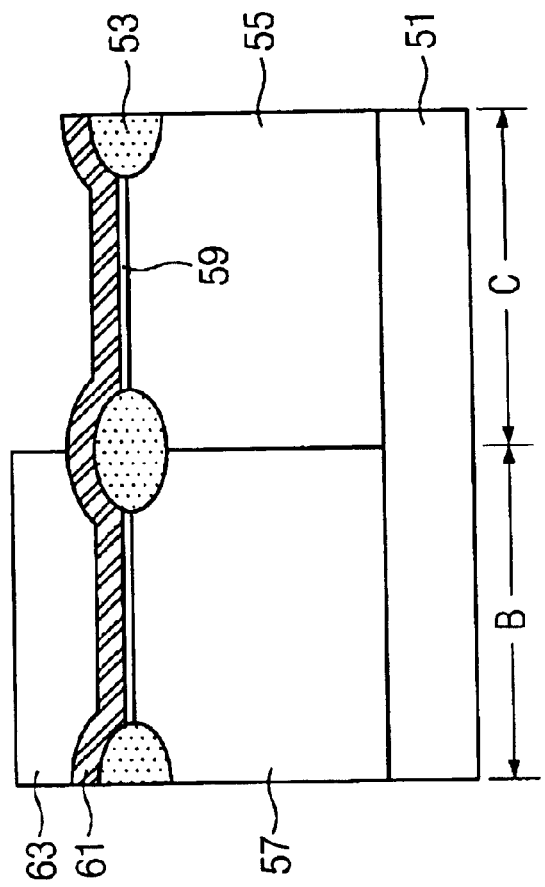

Referring to FIG. 3b, a first metal layer 61 and a first photo resist film (not shown) are sequentially formed on the gate oxide film 59.

Preferably, the first metal layer 61 is selected from a group consisting of TiN, TiAlN, TiSiN, WN and TaN, having work functions ranging from 4.8 to 5.0 eV, and has a thickness ranging from 5 to 1000 Å.

A portion of the first photo resist film on the upper portion of the region C where the peripheral circuit region NMOS is to be formed is removed by exposure and development to form a first photo resist film pattern 63.

Figure 3C:
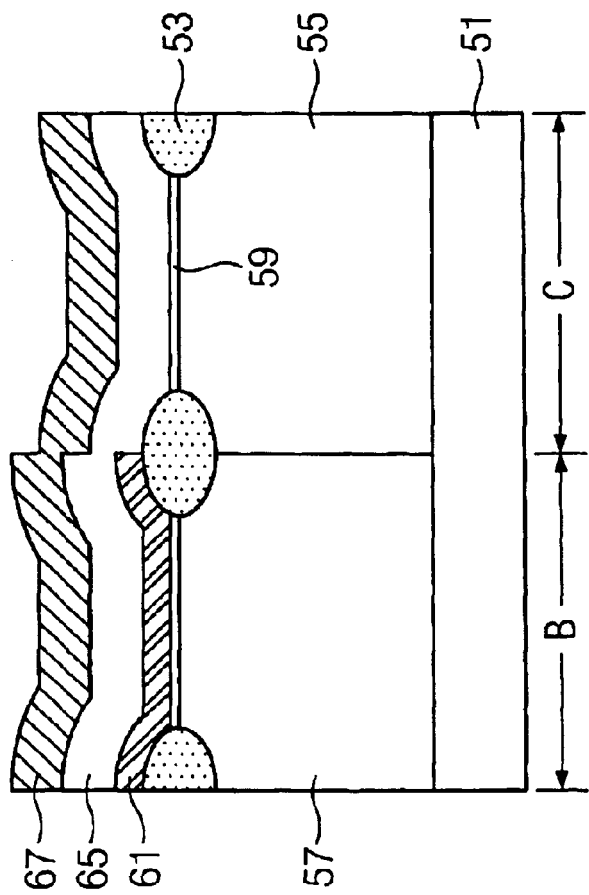

Referring to FIG. 3c, the first metal layer 61 is etched using the first photo resist film pattern 63 as a mask. The first photo resist film pattern 63 is then removed. The etching process of the first metal layer 61 may be a wet etching process using a solution selected from a group consisting of piranha, SC-1, and SC-2.

A polysilicon layer 65 and a second metal layer 67, each having a thickness ranging from 100 to 1000 Å are formed on the entire surface including the first metal layer 61. An amorphous silicon layer may be used instead of the polysilicon layer.

Figure 3D:
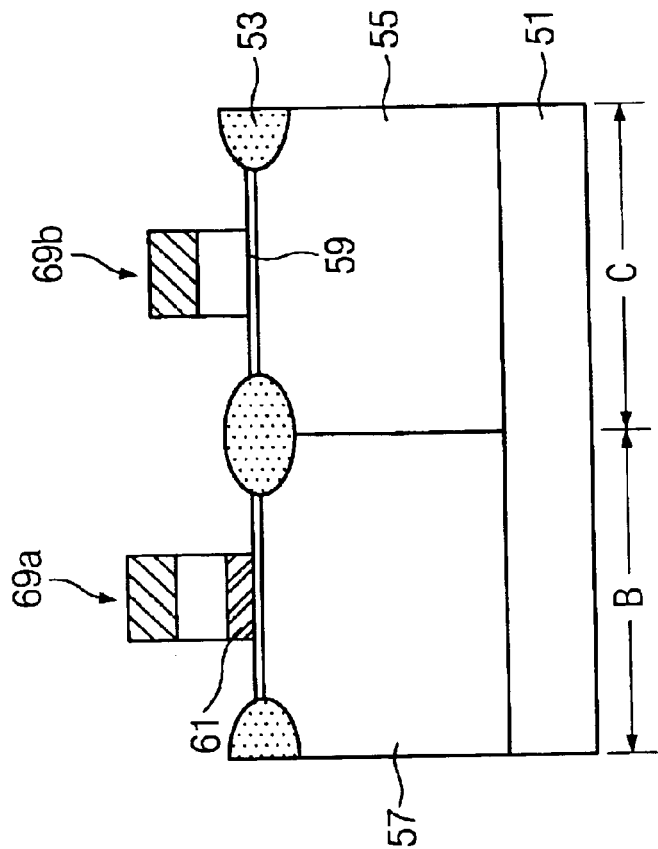

Referring to FIG. 3d, the second metal layer 67, the polysilicon layer 65, and the first metal layer 61 are etched by a photolithography process using a gate electrode mask to form a first gate electrode 69a and a second gate electrode 69b. Here, the first gate electrode 69a is formed on the semiconductor substrate 51 in the region A where the cell region NMOS is to be formed and the region B where the peripheral circuit region PMOS is to be formed. The first gate electrode 69a comprises a stacked structure of the first metal layer 61, the polysilicon layer 65, and the second metal layer 67. The second gate electrode 69b is formed on the semiconductor substrate 51 in the region C where the peripheral circuit region NMOS is to be formed. The second gate electrode 69b comprises a stacked structure of the polysilicon layer 65 and the second metal layer 67.

Figure 3E:
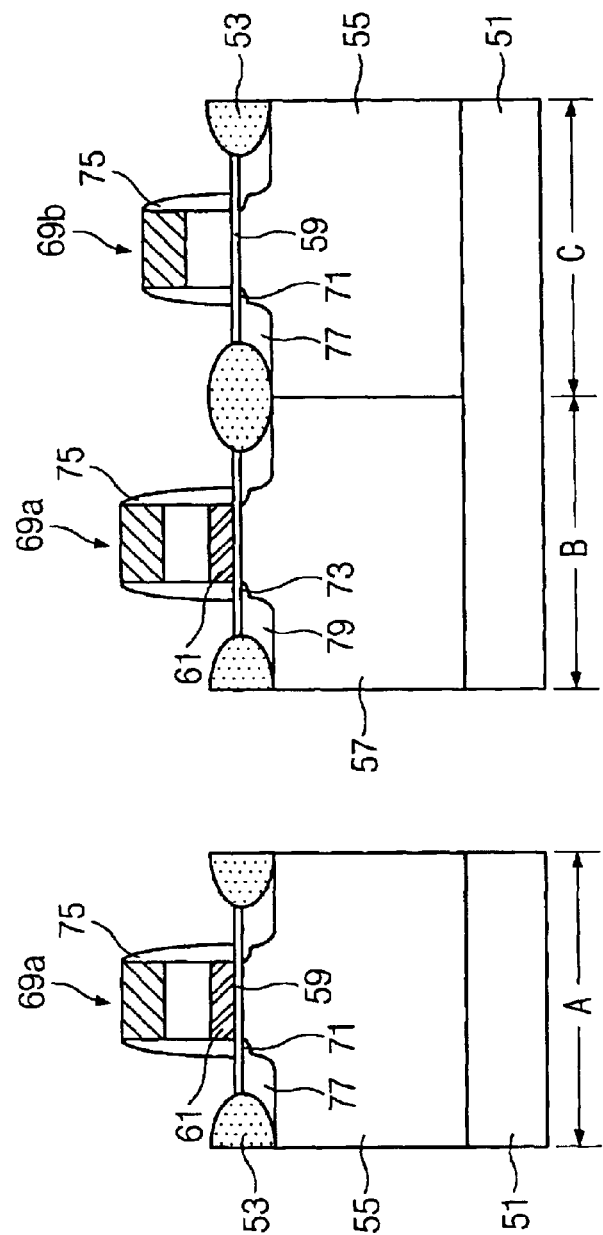

Referring to FIG. 3e, low concentration n-type impurity regions 71 are formed on the surface of the p-well 55 at both sides of the first gate electrode 69a in the region A where the cell region NMOS is to be formed, and at both sides of the second gate electrode 69b in the region C where the peripheral circuit region NMOS is to be formed, by implanting low concentration n-type impurities. A low concentration p-type impurity region 73 is formed on the surface of the n-well 57 at both sides of the first gate electrode 69a in the region B where the peripheral circuit region PMOS is to be formed, by implanting low concentration p-type impurities.

Silicon nitride spacers 75 are then formed on the side wall of the first and the second gate electrodes 69a and 69b, respectively. A high concentration n-type impurity region 77 is formed on the surface of the p-well 55 at both sides of the first gate electrode 69a in the region A where the cell region NMOS is to be formed including the silicon nitride spacer 75, and at both sides of the second gate electrode 69b in the region C where the peripheral circuit region NMOS is to be formed, by implanting a high concentration n-type impurities, thereby forming an n-type source/drain impurity region of an LDD structure.

A high concentration impurity region 79 is formed on the surface of the n-well 57 at both sides of the first gate electrode 69a in the region B where the peripheral circuit region PMOS is to be formed including the silicon nitride spacer 75, by implanting a high concentration p-type impurities, thereby forming a p-type source/drain impurity region of an LDD structure.

FIGS. 4a through 4g are cross sectional views illustrating a method for manufacturing a CMOS of a semiconductor in accordance with a second embodiment of the present invention. Here, "A" indicates a region on which the cell NMOS is to be formed, "B" indicates a region on which the peripheral circuit region PMOS is to be formed, and "C" indicates a region on which the peripheral circuit region NMOS is to be formed.

Figure 4A:
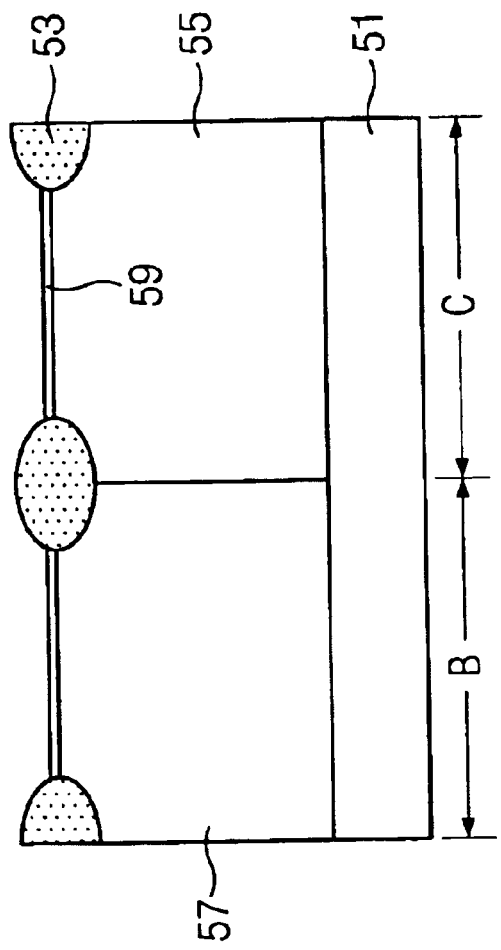
FIGS. 4a through 4g are cross sectional views showing a method for manufacturing a CMOS of a semiconductor device in accordance with a second embodiment of the present invention.

Referring to FIG. 4a, the device isolation film 53 defining an active region is formed on the semiconductor substrate 51.

Thereafter, p-type or n-type impurities are selectively ion-implanted into the semiconductor substrate 51 using an ion implantation mask, and a drive-in process is performed to form the p-well 55 and the n-well 57.

Next, a first oxide film 59 which is gate oxide film is grown to a thickness of 5 to 100 Å by thermally oxidizing the semiconductor substrate 51. Here, a first oxide film 59, a high dielectric film which is not reactive with polysilicon such as $Al_2O_3$, $HfO_2$, $Hf.SiO_2$, or $Zr.SiO_2$ film can also be used instead of a thermal oxide film.

Figure 4B:
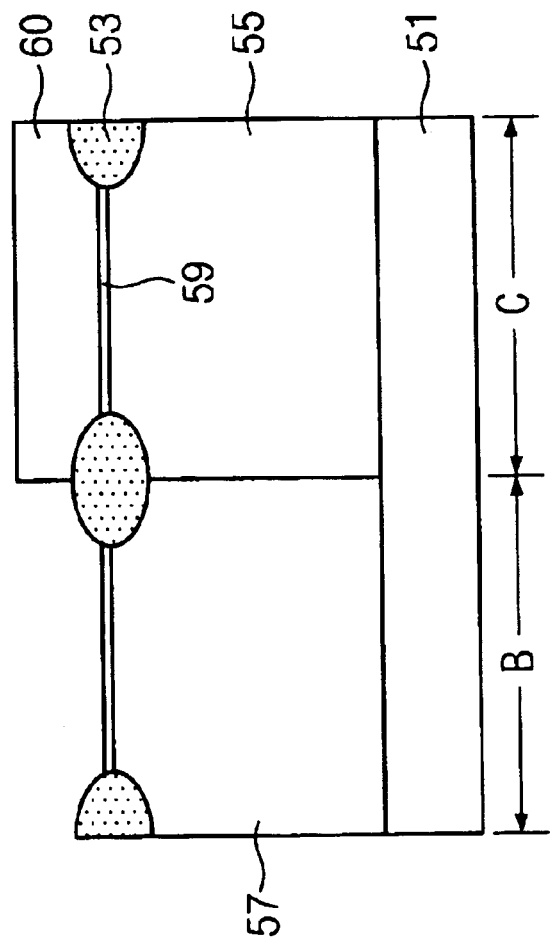

Referring to FIG. 4b, a first photo resist film is coated on the gate oxide film 59, and a first photo resist film pattern 60 covering the upper portion of the region C where the peripheral circuit region NMOS is to be formed is formed by exposure and development process.

Figure 4C:
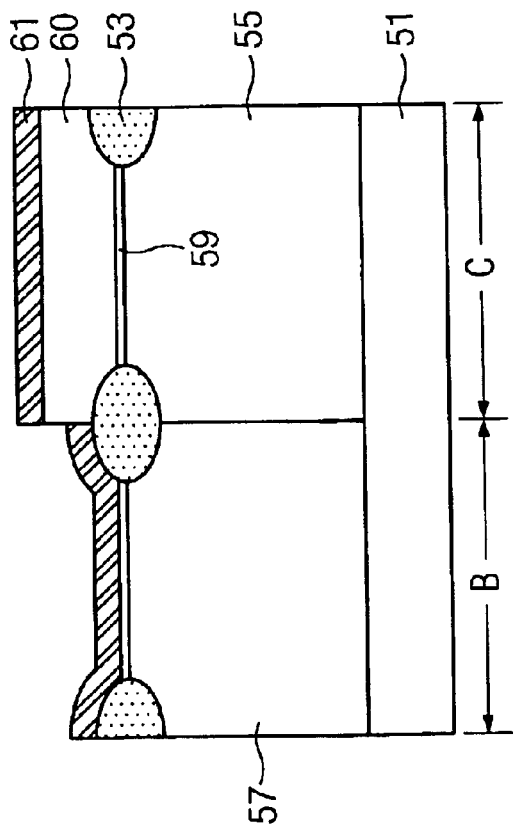
Figure 4C:
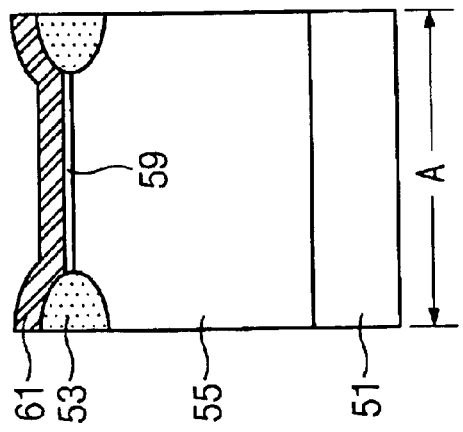

Referring to FIG. 4c, a first metal layer 61 is formed on the entire surface including the first photosensitive pattern 60. Preferably, the first metal layer 61 is selected from a group consisting of TiN, TiAlN, TiSiN, WN and TaN having work functions ranging from 4.8 to 5.0 eV and has a thickness ranging from 5 to 1000 Å.

Figure 4D:
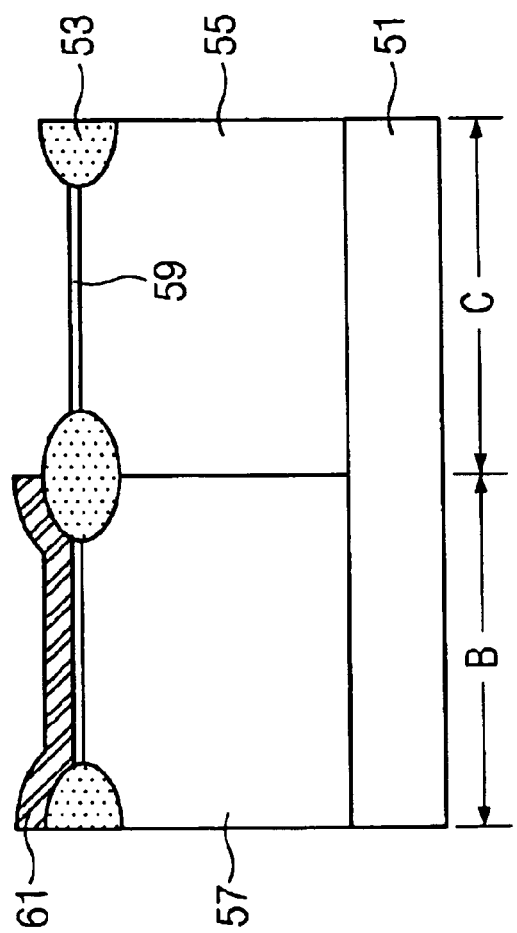

Referring to FIG. 4d, the first metal layer 61 on the first photo resist film pattern 60 is lifted off by removing the first photo resist film pattern 60.

Figure 4E:
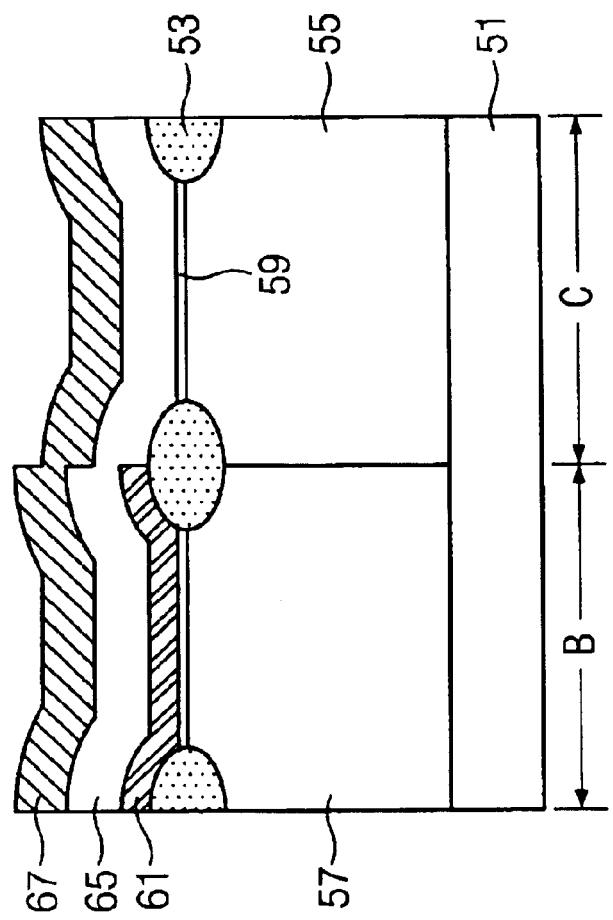

Referring to FIG. 4e, a polysilicon layer 65 and a second metal layer 67, each having a thickness ranging from 100 to 1000 Å are formed on the entire surface including the first metal layer 61.

Figure 4F:
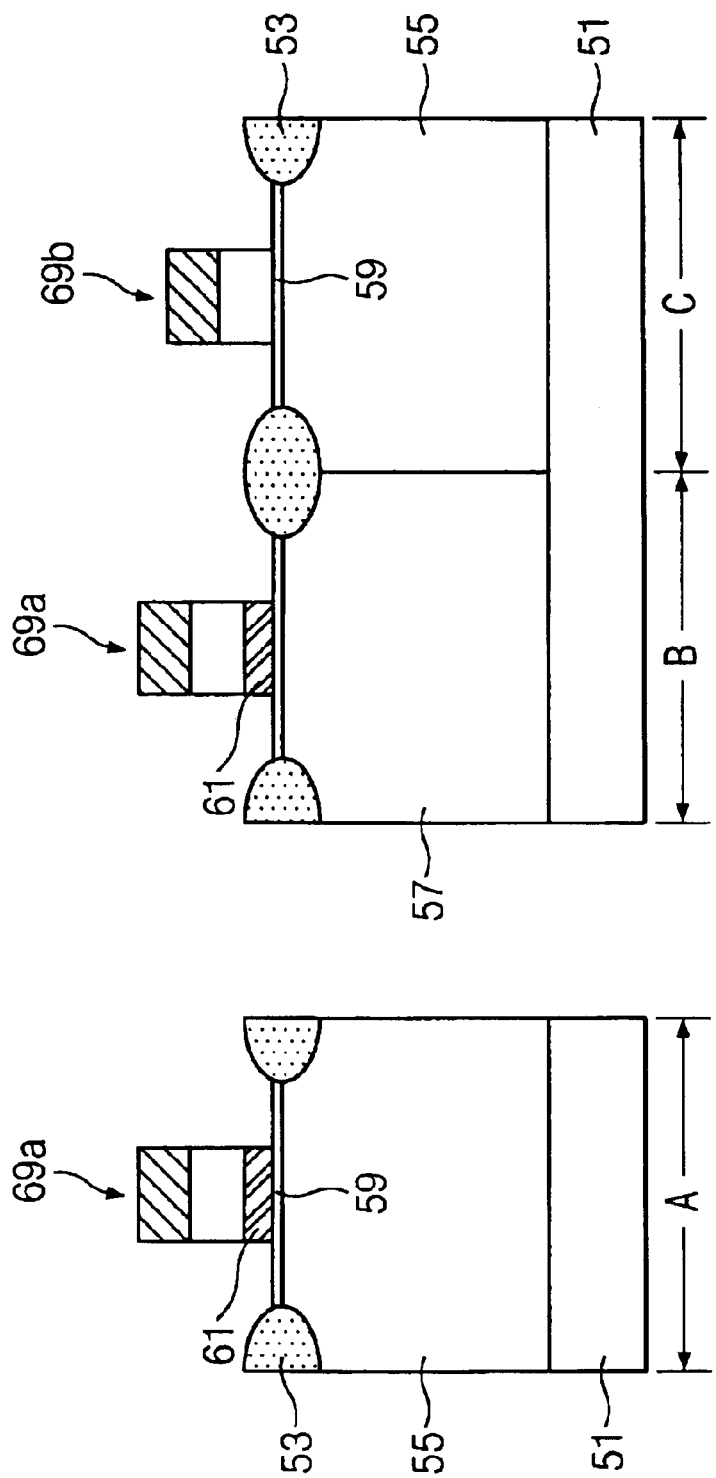

Referring to FIG. 4f, the second metal layer 67, the polysilicon layer 65, and the first metal layer 61 are etched by a photolithography process using a gate electrode mask to form a first gate electrode 69a and a second gate electrode 69b. Here, the first gate electrode 69a is formed on the semiconductor substrate 51 in the region A where the cell region NMOS is to be formed and the region B where the peripheral circuit region PMOS is to be formed. The first gate electrode 69a comprises a stacked structure of the first metal layer 61, the polysilicon layer 65, and the second metal layer 67. The second gate electrode 69b is formed on the semiconductor substrate 51 in the region C where the peripheral circuit region NMOS is to be formed. The second gate electrode 69b comprises a stacked structure of the polysilicon layer 65 and the second metal layer 67.

Figure 4G:
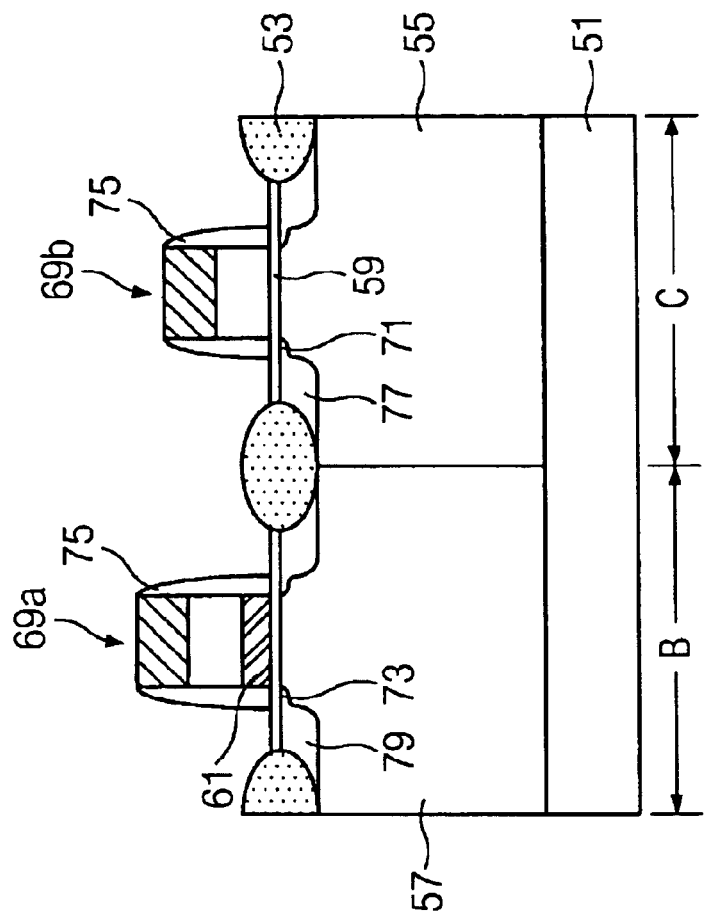
Figure 4G:
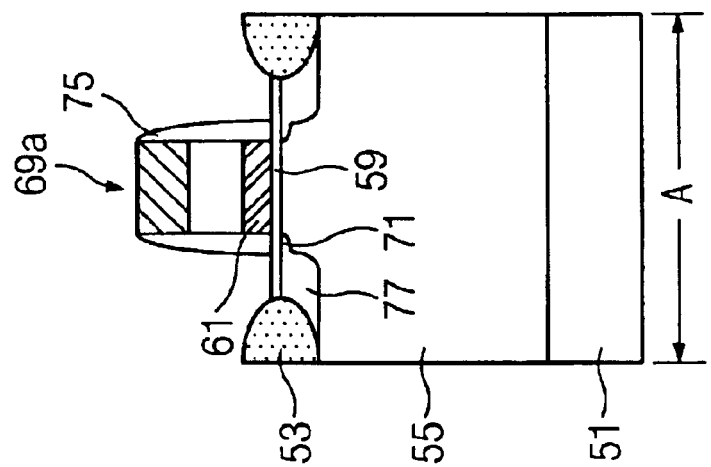

Referring to FIG. 4g, low concentration n-type impurity regions 71 are formed on the surface of the p-well 55 at both sides of the first gate electrode 69a in the region A where the cell region NMOS is to be formed, and at both sides of the second gate electrode 69b in the region C where the peripheral circuit region NMOS is to be formed, by implanting low concentration n-type impurities. A low concentration p-type impurity region 73 is formed on the surface of the n-well 57 at both sides of the first gate electrode 69a in the region B where the peripheral circuit region PMOS is to be formed, by implanting low concentration p-type impurities.

Silicon nitride spacers 75 are then formed on the side wall of the first and the second gate electrodes 69a and 69b, respectively. A high concentration n-type impurity region 77 is formed on the surface of the p-well 55 at both sides of the first gate electrode 69a in the region A where the cell region NMOS is to be formed including the silicon nitride spacer 75, and at both sides of the second gate electrode 69b in the region C where the peripheral circuit region NMOS is to be formed, by implanting a high concentration n-type impurities, thereby forming an n-type source/drain impurity region of an LDD structure.

A high concentration impurity region 79 is formed on the surface of the n-well 57 at both sides of the first gate electrode 69a in the region B where the peripheral circuit region PMOS is to be formed including the silicon nitride spacer 75, by implanting a high concentration p-type impurities, thereby forming a p-type source/drain impurity region of an LDD structure.

The inventions provide a CMOS device having a surface channel, with improved characteristics, yield and reliability, by forming gate electrodes of the cell region NMOS and the peripheral circuit region PMOS in a stacked structure comprising the first metal layer/the polysilicon layer/the second metal layer; and by forming a gate electrode of the peripheral circuit region NMOS in a stacked structure comprising the polysilicon layer/the second metal layer.

To be more specific, the gate electrode with the above structure, without requiring any extra transient ion implantation process, forms the CMOS with the surface channel more easily than before by having the threshold voltage of the cell NMOS be +1V, the threshold voltage of the peripheral PMOS be −0.5V and below, and the threshold voltage of the peripheral NMOS be +0.5V and below.

Next, since the cell NMOS already has +1V of threshold voltage, back bias does not have to be applied separately to achieve the +1V threshold voltage, and the device with low power consumption is easily formed.

Finally, the CMOS with the surface channel according to the present invention does not experience the gate depletion effect or boron penetration phenomena, which were typically observed in the traditional dual polysilicon gate electrode because the doping process was not properly performed during the formation of the gate electrode.

While the invention has been described in conjunction with various embodiments, they are illustrative only. Accordingly, many alternative, modifications and variations will be apparent to persons skilled in the art in light of the foregoing detailed description. The foregoing description is intended to embrace all such alternatives and variations falling with the spirit and broad scope of the appended claims.

What is claimed is:

1. A complementary metal oxide semiconductor (CMOS) semiconductor device, comprising:

a first gate electrode having a stacked structure of a first metal layer, a polysilicon layer and a second metal layer formed in a p-well region of a cell region and an n-well region of a peripheral circuit region; and a second gate electrode having a stacked structure of the polysilicon layer and the second metal layer formed on a p-well of a peripheral circuit region.

2. The device of claim 1, wherein the first metal layer has a work function ranging from 4.8 eV to 5.0 eV.

3. The device of claim 1, wherein the first metal layer has a thickness ranging from 5 to 1000 Å.

4. The device of claim 1, wherein the first metal layer comprises at least one metal layer selected from the group consisting of TiN, TiAlN, TiSiN, WN and TaN.

5. The device of claim 1, wherein the polysilicon layer have a thickness ranging from 10 to 1000 Å.

6. The device of claim 1, wherein the second metal layer have a thickness ranging from 10 to 1000 Å.

* * * * *